(12) United States Patent (10) Patent No.: US 12,696,634 B2
Yan et al. (45) Date of Patent: Jul. 28, 2026

(54) DISPLAY PANEL AND ELECTRONIC DEVICE

(71) Applicants: Chengdu BOE Optoelectronics Technology Co., Ltd., Chengdu (CN); BOE Technology Group Co., Ltd., Beijing (CN)

(72) Inventors: Zhuoran Yan, Beijing (CN); Yanwei Lu, Beijing (CN); Hongjun Zhou, Beijing (CN); Quan Shi, Beijing (CN); Yudiao Cheng, Beijing (CN); Chengjie Qin, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 377 days.

(21) Appl. No.: 18/293,308

(22) PCT Filed: May 19, 2023

(86) PCT No.: PCT/CN2023/095305
§ 371 (c)(1),
(2) Date: Jan. 29, 2024

(87) PCT Pub. No.: WO2023/226897
PCT Pub. Date: Nov. 30, 2023

(65) Prior Publication Data
US 2025/0098441 A1 Mar. 20, 2025

(30) Foreign Application Priority Data
May 27, 2022 (CN) .......................... 202210603858.1

(51) Int. Cl.
*H10K 59/126* (2023.01)
*H10K 59/121* (2023.01)
*H10K 59/131* (2023.01)

(52) U.S. Cl.
CPC ....... *H10K 59/126* (2023.02); *H10K 59/1213* (2023.02); *H10K 59/131* (2023.02)

(58) Field of Classification Search
CPC ............. H10K 59/126; H10K 59/1213; H10K 59/131; H10D 86/441; H10D 86/60
See application file for complete search history.

(56) References Cited

U.S. PATENT DOCUMENTS 10,748,979 B2 * 8/2020 Kim ...................... G09G 3/3233
2018/0061908 A1 * 3/2018 Shim .................. H10K 59/1213
(Continued)

FOREIGN PATENT DOCUMENTS

CN 105321957 A 2/2016
CN 111243510 A 6/2020
(Continued)

*Primary Examiner* — J. E. Schoenholtz
(74) *Attorney, Agent, or Firm* — IPro, PLLC

(57) ABSTRACT

Provided is a display panel, including: a base substrate, a plurality of display sub-pixels, a plurality of power voltage lines, and a plurality of data signal lines. The display sub-pixel includes a display pixel drive circuit connected to the power voltage line and the data signal line. The display pixel drive circuit includes at least a first transistor and a second transistor. Each of the first transistor and the second transistor includes an active layer. The first transistor includes a shield. An orthographic projection of the shield on the base substrate is at least partially overlapped with an orthographic projection of a channel connection region of the active layer of the first transistor on the base substrate. An orthographic projection of the shield and the data signal
(Continued)

line is not overlapped with an orthographic projection of the active layer of the second transistor on the base substrate.

20 Claims, 12 Drawing Sheets

(56)                  References Cited

U.S. PATENT DOCUMENTS

2020/0168147 A1 *    5/2020    Na .......................... G09G 3/325
2022/0013610 A1      1/2022    Li et al.
2023/0030891 A1      2/2023    Du et al.
2023/0060545 A1      3/2023    Du et al.
2023/0209884 A1 *    6/2023    Shim .................. H10D 30/6723
                                                                257/40

FOREIGN PATENT DOCUMENTS

CN          113950746  A      1/2022
CN          114255703  A      3/2022
CN          114255704  A      3/2022
CN          115207048  A     10/2022

* cited by examiner

Gate 2 shield layer

Previous column of VDD

T2 double-gate layer

Previous column of Data

100

10

200

A1

A2

105

B1

B2

105

Cst1

EM

Vinit

104

Cst2

D1

DISPLAY PANEL AND ELECTRONIC DEVICE

CROSS-REFERENCE TO RELATED APPLICATION

This application a U.S. national stage of international application No. PCT/CN2023/095305, field on May 19, 2023, which claims priority to Chinese patent application No. 202210603858.1, filed on May 27, 2022, entitled "DISPLAY PANEL AND ELECTRONIC DEVICE," the contents of which are incorporated herein by reference in their entireties.

TECHNICAL FIELD

The present disclosure relates to the display field, and in particular relates to a display panel and an electronic device.

BACKGROUND

In designing wirings for display panels, impacts of coupling capacitance (loading) and power consumption on the display effect of the panels need to be fully considered. However, more overlapping regions are present for wirings for conventional display panels, resulting in a larger overall coupling capacitance, higher power consumption, and poorer performance.

SUMMARY

In view of the above problem, embodiments of the present disclosure provide a display panel and an electronic device.

According to some embodiments of the present disclosure, a display panel is provided.

The display panel includes: a base substrate having a display region; and a plurality of display sub-pixels, a plurality of power voltage lines, and a plurality of data signal lines that are disposed in the display region. Each of the display sub-pixels includes a display pixel drive circuit. The power voltage lines and the data signal lines are connected to the display pixel drive circuits. Each of the display pixel drive circuits comprises at least a first transistor and a second transistor connected to the first transistor. Each of the data signal lines is connected to the second transistor. Each of the first transistor and the second transistor includes an active layer. The first transistor further includes a shield connected to each of the power voltage lines. An orthographic projection of the shield on the base substrate is at least partially overlapped with an orthographic projection of a channel connection region of the active layer of the first transistor on the base substrate, and an orthographic projection of the shield and the data signal line is not overlapped with an orthographic protection of the active layer of the second transistor on the base substrate.

In some embodiments, the display sub-pixels are arranged in a plurality of columns, each column of the display sub-pixels corresponding to one of the power voltage lines; and the shield is connected to the power voltage line corresponding to the display sub-pixel where the shield is disposed.

In some embodiments, the display panel further includes: a semiconductor layer, a first gate layer, a second gate layer, and a first conductive layer that are sequentially stacked on the base substrate. The semiconductor layer includes the active layers of the first transistor and the second transistor.

In some embodiments, the shield is disposed on the second gate layer.

In some embodiments, the base substrate further has a non-display region disposed outside the display region, and the display panel further includes a plurality of virtual sub-pixels disposed in the non-display region. Each of the virtual sub-pixels includes a virtual pixel drive circuit. A boundary of the virtual pixel drive circuit in a row direction is the same as a boundary of the display pixel drive circuit in the row direction, and a boundary of the virtual sub-pixel drive circuit in a column direction is the same as a boundary of the display pixel drive circuit in the column direction.

In some embodiments, the virtual sub-pixel further includes a virtual light-emitting unit; and the display panel further includes an anode layer including an anode of the virtual light-emitting unit, which is laid in an entire layer.

In some embodiments, the display panel further includes a cathode layer on a side, away from the base substrate, of the anode layer; the display sub-pixel further includes a light-emitting unit driven by the display pixel drive circuit to emit light; and the anode of the virtual light-emitting unit is connected to a low power voltage line to transmit a low power voltage signal supplied by the low power voltage line through the anode layer to a cathode layer of the display region. The cathode layer includes a cathode of the light-emitting unit.

In some embodiments, the virtual pixel drive circuit is not connected to the anode of the virtual light-emitting unit.

In some embodiments, the first transistor includes a source, a drain, and a double-gate. The source and the drain are disposed in the first conductive layer, and the double-gate is disposed in the first gate layer.

In some embodiments, the source and the drain of the first transistor are connected through the active layer of the first transistor, and the active layer connected to the source and the drain has at least one L-shaped structure; and the double gates have a T-shaped structure. One of L-shaped structures in the T-shaped structure is reversely superimposed with the L-shaped structure of the active layer to enclose a square region.

According to some embodiments of the present disclosure, an electronic device is provided. The electronic device at least includes the display panel according to any of the embodiments of the present disclosure.

Figure 1:
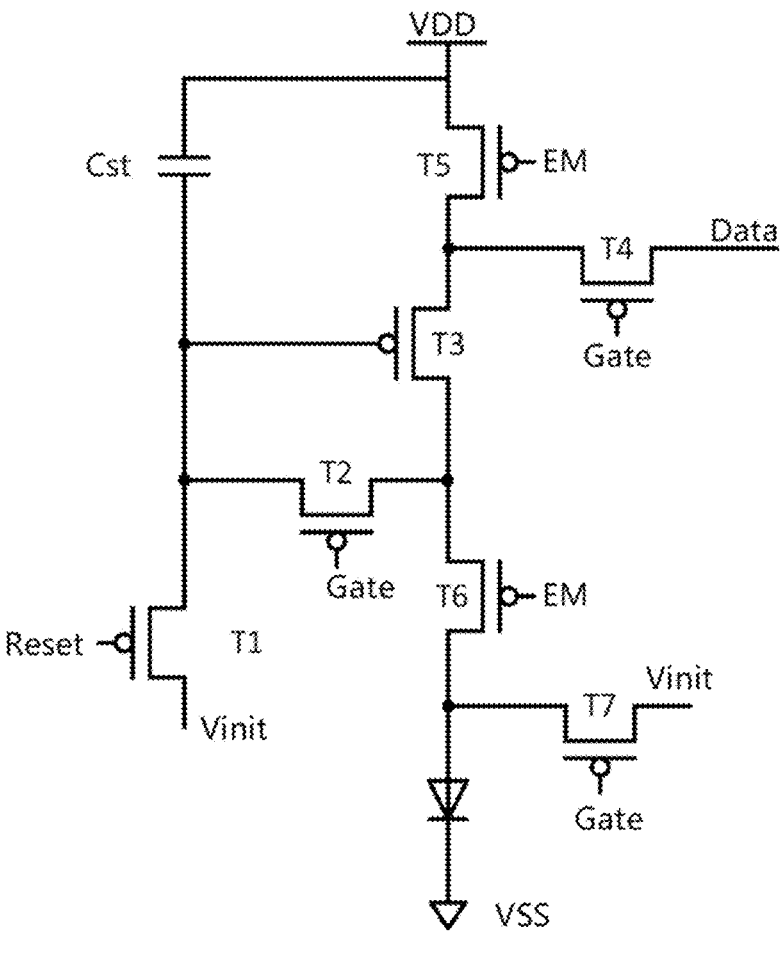
FIG. 1 is a schematic diagram of a 7T1C circuit according to some embodiments of the present disclosure.

Reference numerals and denotations thereof:

10—base substrate; 100—display region; 200—non-display region; 104—shield; 101—power voltage line; 102—data signal line; 103—display pixel drive circuit; 105—gate line; 602—buffer layer; 603—semiconductor layer; 604—first gate insulating layer; 605—first gate layer; 606—second gate insulating layer; 607—second gate layer; 608—interlayer insulating layer; 609—first conductive layer; 610—planarization layer; A1—channel connection region of first transistor; A2—channel connection region of second transistor; B1—gate of first transistor; B2—gate of second transistor.

DETAILED DESCRIPTION

For clearer descriptions of the objects, technical solutions, and advantages in the embodiments of the present disclosure, the following briefly introduces the accompanying drawings required for describing the embodiments. Apparently, the accompanying drawings in the following description illustrate merely some not all of the embodiments of the present disclosure. Based on the described embodiments of the present disclosure, all other embodiments obtained by those skilled in the art without creative efforts are within the scope of protection of the present disclosure.

Unless otherwise defined, technical or scientific terms used herein shall have their ordinary meaning as understood by a person of ordinary skill in the art to which this disclosure pertains. The terms "first," "second," and the like, as used in the patent disclosure, do not denote any order, number, or significance, but are used only to distinguish between different components. Similar terms such as "includes" or "contains" mean that the element or object that now precedes "includes" or "contains" encompasses the elements or objects listed after "includes" or "contains" and their equivalents, and does not exclude other elements or objects. The terms such as "connected" or "coupled" are not limited to physical or mechanical connections, but may include electrical connections, whether direct or indirect. The terms "up," "down," "left," "right," and the like are used only to indicate relative positional relationships. When the absolute position of the described object is changed, the described relative positional relations may be changed accordingly.

For clear and concise description of the embodiments of the present disclosure, the detailed descriptions of known functions and known components are omitted in the present disclosure.

For a display panel in some practices, display sub-pixels use 2T1C, 7T1C, or other display pixel drive circuits, wherein T refers to a transistor and C refers to a capacitor. For example, 7T1C means that the display pixel drive circuit includes seven transistors and one capacitor.

FIG. 1 is a schematic diagram of a 7T1C circuit according to some embodiments of the present disclosure. A first transistor T2 is a double-gate transistor, wherein the double-gate transistor refers to a transistor in which a channel connection region of an active layer passes through a gate of the transistor twice.

In the 7T1C circuit illustrated in FIG. 1, gates of the first transistor T2 and a gate of a second transistor T4 are connected to a same gate line, and a gate of a third transistor T7 and the gates of the first transistor T2 in the next row of sub-pixels are connected to a same gate line.

Figure 2:
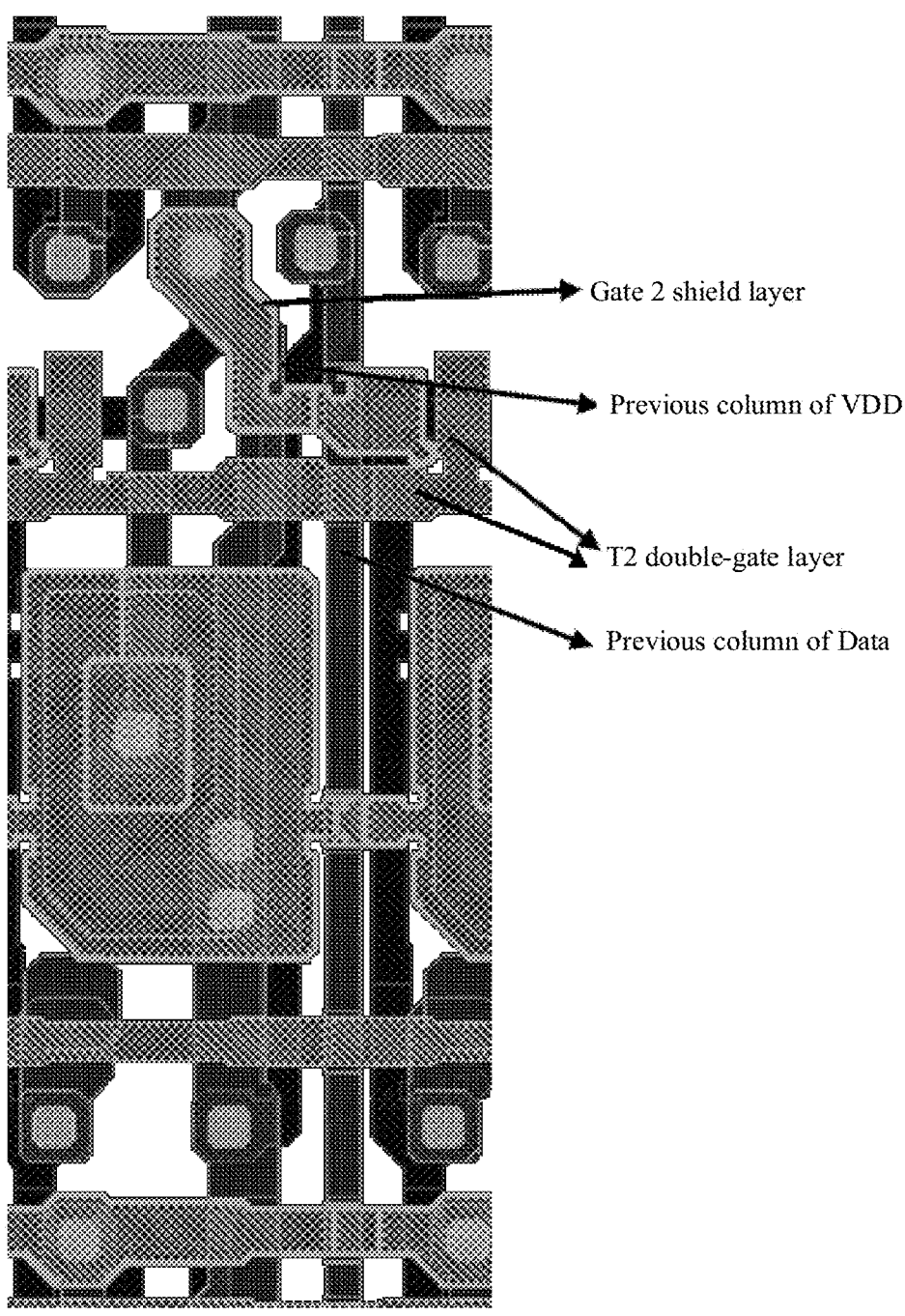
FIG. 2 is a wiring diagram of a portion of a display pixel drive circuit of display sub-pixels provided in some practices.

With respect to T2, the channel connection region of an active layer in the transistor needs to be shielded. FIG. 2 is a wiring diagram of a portion of a display pixel drive circuit in some practices. Referring to FIG. 2, the channel connection region of T2 is shielded by a shield in a second gate layer (Gate 2). The shield is connected to a power voltage line (VDD) in a previous column, and voltage stability of the shield is ensured by connecting the VDD, such that unstable capacitances between the shield and other film layers due to the floating state of the shield are avoided.

As illustrated in FIG. 2, since the shield shields the channel connection region and is also connected to the VDD in the previous column, the shield is overlapped with a data line (Data) in a previous column to form an overlap capacitance, thereby increasing data loading. The data line includes a portion on a first conductive layer and a portion on a semiconductor layer. With this design, T2 of a column of display sub-pixels at the leftmost edge of the display panel is not shielded.

Based on the above considerations, in the embodiments of the present disclosure, the wiring design for the display panel is optimized, which not only reduces the loading and optimizes the display, but also reduces the power consumption and improve the competitiveness of the product.

Figure 3:
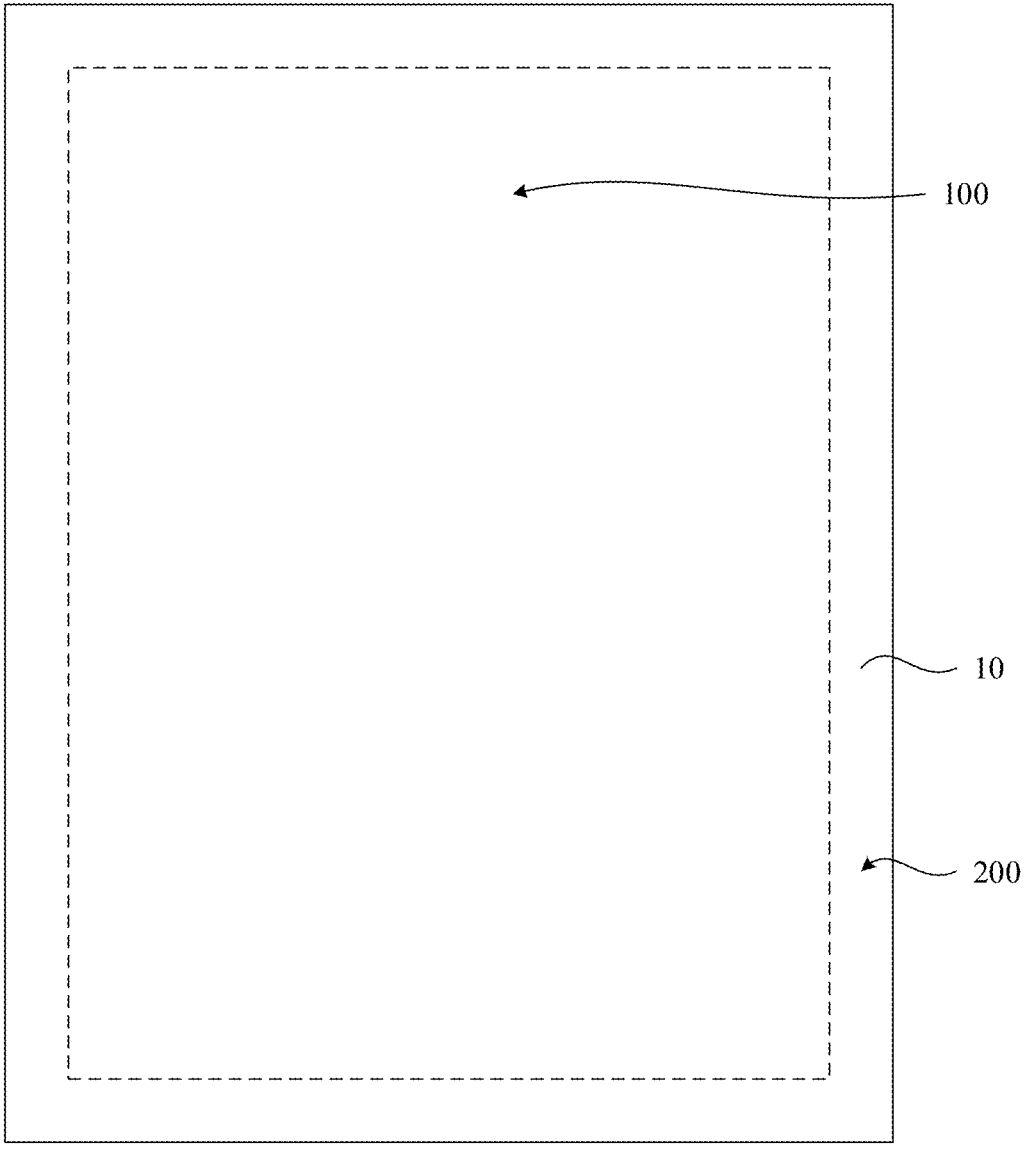
FIG. 3 is a schematic diagram of a display panel according to some embodiments of the present disclosure.

FIG. 3 is a schematic plan view of a display panel according to some embodiments of the present disclosure. Referring to FIG. 3, the display panel includes a base substrate 10. The base substrate 10 includes a display region 100 and a non-display region 200 outside the display region 100.

Figure 4:
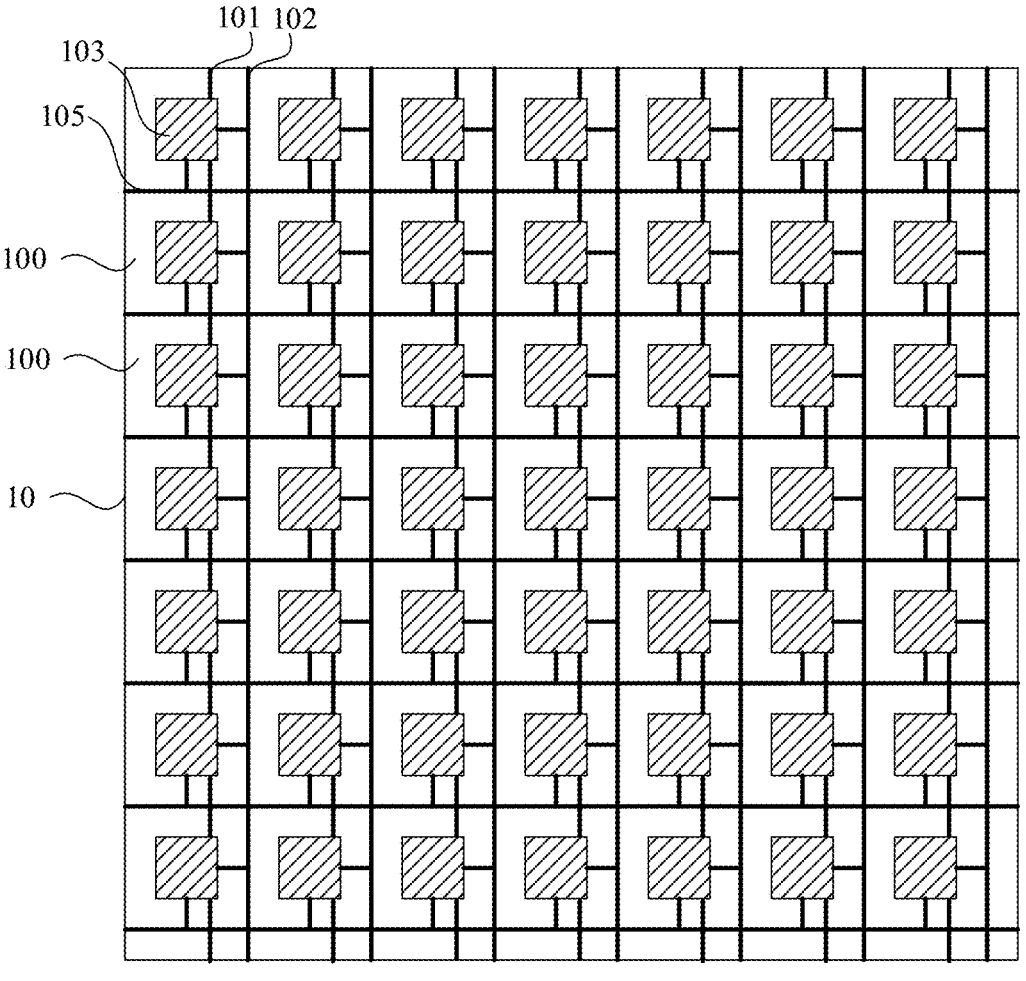
FIG. 4 is a schematic diagram of a display panel according to some embodiments of the present disclosure.

FIG. 4 is a schematic structural diagram of a display region of a display panel according to some embodiments of the present disclosure. Referring to FIG. 4, the display panel further includes a plurality of display sub-pixels, a plurality of power voltage lines 101 and a plurality of data signal lines 102, which are disposed in a display region 100. The display sub-pixels include display pixel drive circuits 103. The power voltage lines 101 and the data signal lines 102 are connected to the display pixel drive circuits 103.

In one possible example, the plurality of display sub-pixels in the display region 100 are arranged in arrays.

In other possible examples, the plurality of display sub-pixels in the display region 100 are also arranged in other fashions instead of arrays, but the plurality of display sub-pixels are still arranged in a plurality of rows and a plurality of columns.

Figure 5:
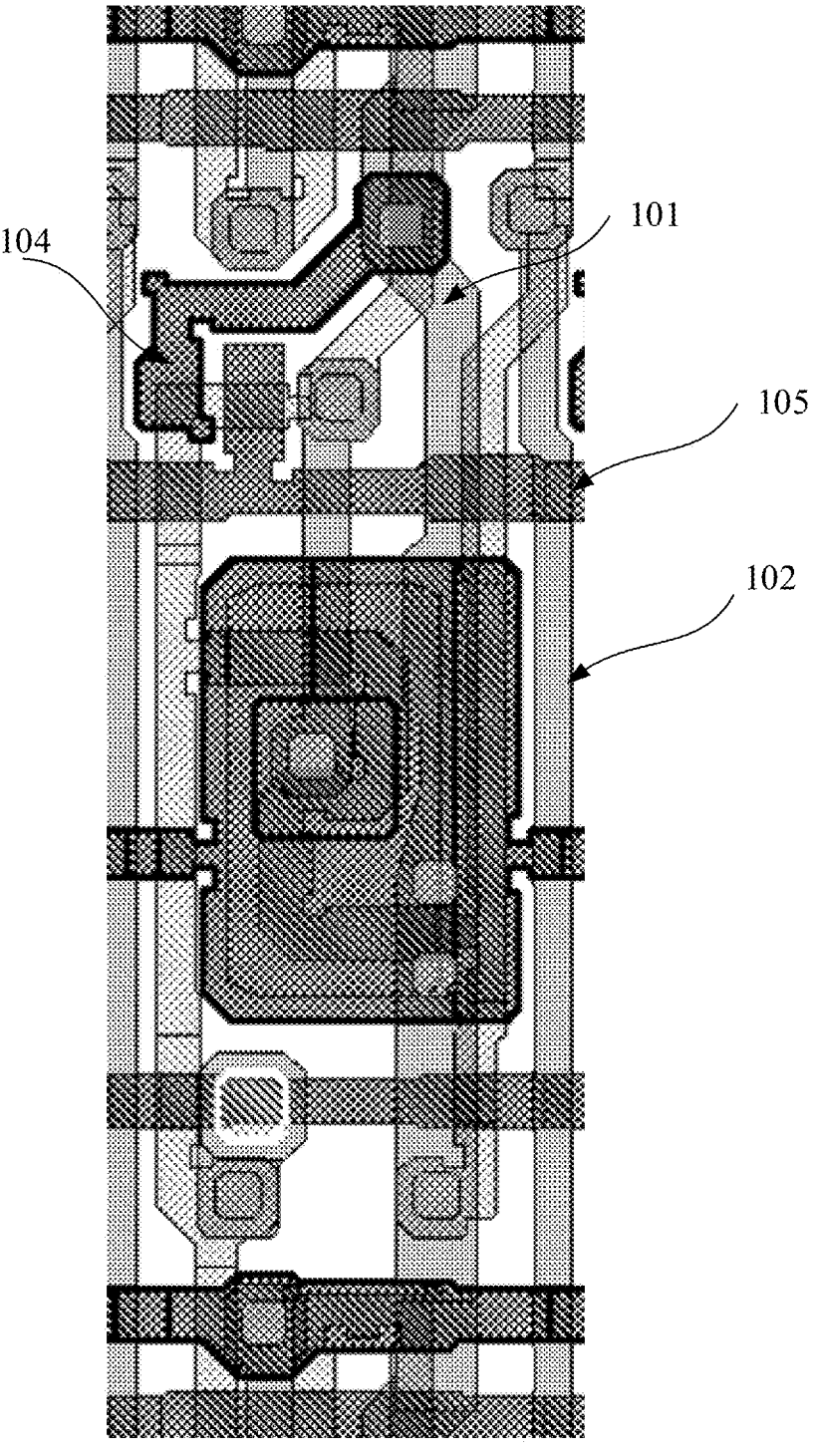
FIG. 5 is a wiring diagram of a portion of a display pixel drive circuit of a display panel according to some embodiments of the present disclosure.

FIG. 5 is a wiring diagram of a portion of a display pixel drive circuit according to some embodiments of the present disclosure. Referring to FIG. 5, the display pixel drive circuit at least includes a first transistor (i.e., T2 in FIG. 1) and a second transistor (i.e., T4 in FIG. 1) connected to the first transistor. A data signal line 102 is connected to the second transistor. Each of the first transistor and the second transistor includes an active layer. The first transistor further includes a shield 104. The shield 104 is connected to a power voltage line 101. An orthographic projection of the shield 104 on a base substrate is at least partially overlapped with an orthographic projection of a channel connection region of the active layer of the first transistor on the base substrate.

An orthographic projection of the shield and the data signal line is not overlapped with an orthographic projection of the active layer of the second transistor on the base substrate.

In the embodiments, by adjusting a position of the channel connection region of the active layer and a position of the corresponding shield, the shield shields the channel connection region, but is not overlapped with the data signal line 102 or active layers of other transistors. As such, the problem that a larger overall coupling capacitance, a higher power consumption of the product, and poorer performance are caused due to a large number of overlapping regions present in the wiring of the display panel in some practices is addressed. In this way, the overall coupling capacitance is reduced, the power consumption of the product is decreased, and the performance of the product is improved.

Exemplarily, the orthographic projection of the shield 104 on the base substrate is coincident with the orthographic projection of the channel connection region of the active layer of the first transistor on the base substrate.

The display sub-pixel includes, in addition to the display pixel drive circuit, a light-emitting unit (not illustrated in drawings), which is driven to emit light by the display pixel drive circuit. The light-emitting unit typically includes structures such as an anode, a light-emitting layer, and a cathode, which are not described herein.

Referring again to FIG. 4, the display panel further includes a gate line 105. The gate line 105 is connected to the display pixel drive circuit 103.

In some embodiments of the present disclosure, the first transistor is the double-gate transistor, which can be understood as a transistor group. The transistor group includes a first sub-transistor and a second sub-transistor. The first sub-transistor is connected to the second sub-transistor in series. An active layer of the first sub-transistor is connected to an active layer of the second sub-transistor via the channel connection region.

Referring again to FIG. 4, the plurality of display sub-pixels are arranged in a plurality of columns, and each column of the display sub-pixels corresponds to one of the power voltage lines 101.

Referring again to FIG. 5, the shield 104 is connected to the power voltage line 101 corresponding to the display sub-pixel where the shield 104 is disposed.

In some embodiments, by connecting the shield 104 to the power voltage line 101 corresponding to the display sub-pixel where the shield 104 is disposed, the shield 104 is prevented from being connected to the power voltage lines 101 in other columns, and hence the shield 104 is prevented from being overlapped with the data lines or active layers of other transistors.

Additionally, in this way, T2 of a column of display sub-pixels at the leftmost edge of the display panel is shielded.

FIG. 5 merely illustrates an example based on FIG. 4. A person skilled in the art may derive adaptations based on the above inventive concepts, depending on the actual display pixel drive circuit. However, such adaptations shall be considered as falling within the scope of protection of the embodiments of the present disclosure.

In some embodiments of the present disclosure, the display pixel drive circuit includes a metal layer, a semiconductor layer, an insulating layer, and the like. Such film layers of the display panel are described hereinafter with reference to FIG. 6.

Figure 6:
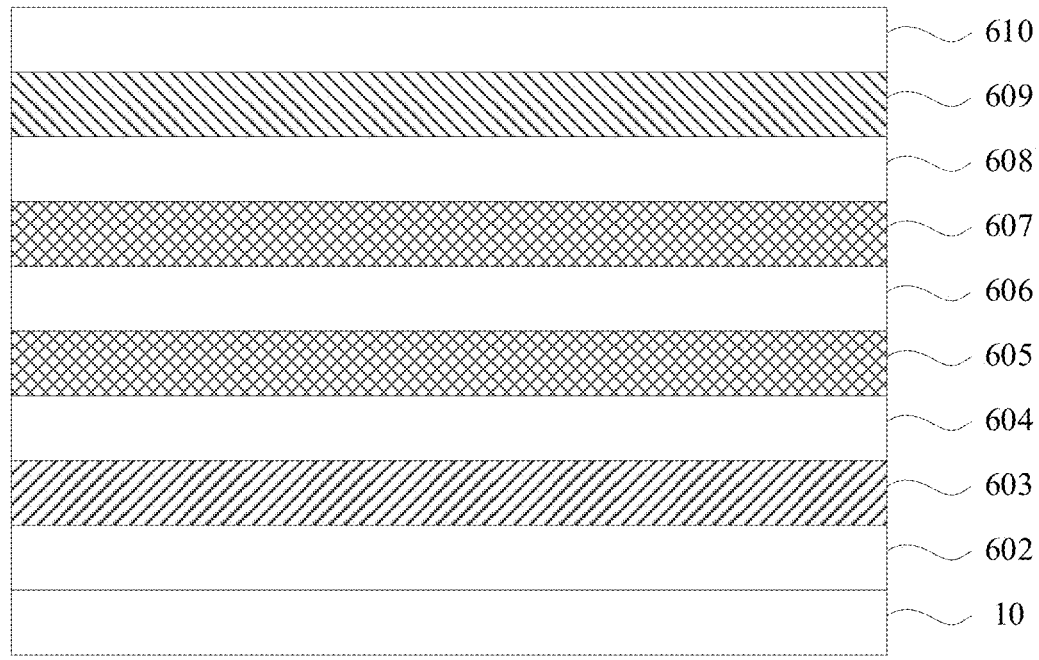
FIG. 6 is a schematic structural diagram of a film layer of a display panel according to some embodiments of the present disclosure.

Referring to FIG. 6, a display panel includes: in addition to a base substrate 10, a semiconductor layer 603, a first gate layer 605, a second gate layer 607, and a first conductive layer 609 that are sequentially stacked on the base substrate 10.

The semiconductor layer includes active layers of a first transistor and a second transistor and a channel connection region.

Referring again to FIG. 6, the display panel further includes a buffer layer 602, a first gate insulating layer 604, a second gate insulating layer 606, an interlayer insulating layer 608, and a planarization layer 610. The buffer layer 602, the semiconductor layer 603, the first gate insulating layer 604, the first gate layer 605, the second gate insulating layer 606, the second gate layer 607, the interlayer insulating layer 608, the first conductive layer 609, and the planarization layer 610 are sequentially stacked.

A plurality of vias are formed in the first gate insulating layer 604, the second gate insulating layer 606, and the interlayer insulating layer 608. The first conductive layer 609 is connected to the semiconductor layer 603 by some of these vias. The first conductive layer 609 is connected to the first gate layer 605 by some of these vias. The first conductive layer 609 is connected to the second gate layer 607 by some of these vias.

In other embodiments, the display panel includes only one gate layer and one gate insulating layer.

In other embodiments, the display panel includes two source-drain layers, wherein the insulating layer is disposed between the two source-drain layers.

Exemplarily, the base substrate 601 is a glass substrate or a plastic substrate, such that light transmission of the base substrate is ensured.

Exemplarily, the buffer layer 602 is an inorganic insulating layer, for example, a silicon nitride (SiN) layer or a silicon oxynitride (SiON) layer. The buffer layer 602 is also an organic insulating layer, for example, an epoxy resin insulating layer. The silicon nitride and the epoxy resin are good insulators to ensure insulation of the buffer layer 602.

Exemplarily, the semiconductor layer 603 is a low temperature polysilicon layer or an indium gallium zinc oxide semiconductor layer.

Exemplarily, the first gate insulating layer 604 and the second gate insulating layer 606 are silicon nitrides, silicon nitride oxide layers, or epoxy resin insulating layers.

Exemplarily, the first gate layer 605 and the second gate layer 607 are indium tin oxide layers or metal layers, for example, copper (Cu) layers.

Exemplarily, the interlayer insulating layer 608 is a silicon nitride layer, a silicon nitride oxide layer, or an epoxy resin insulating layer.

Exemplarily, the first conductive layer 609 is an indium tin oxide layer or the metal layer.

Exemplarily, the planarization layer 610 is a silicon nitride layer, a silicon nitride oxide layer, or an epoxy resin insulating layer.

Figure 7:
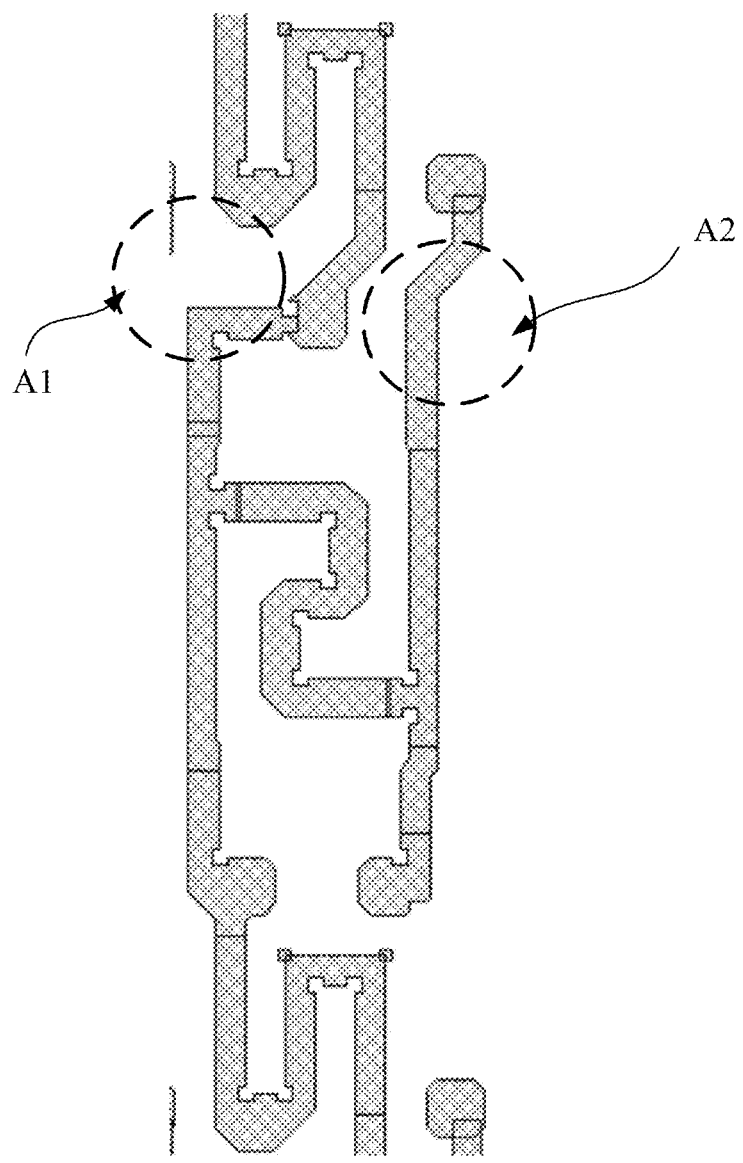
FIG. 7 is a wiring diagram of a semiconductor layer according to some embodiments of the present disclosure.

With respect to FIG. 5, FIG. 7 is a wiring diagram of the semiconductor layer of FIG. 5. Referring to FIG. 7, the semiconductor layer includes a channel connection region A1 and a channel connection region A2, wherein the channel connection region A1 is a channel connection region of the first transistor and the channel connection region A2 is a channel connection region of the second transistor.

Figure 8:
FIG. 8 is a wiring diagram of a first gate layer according to some embodiments of the present disclosure.
Figure 8:
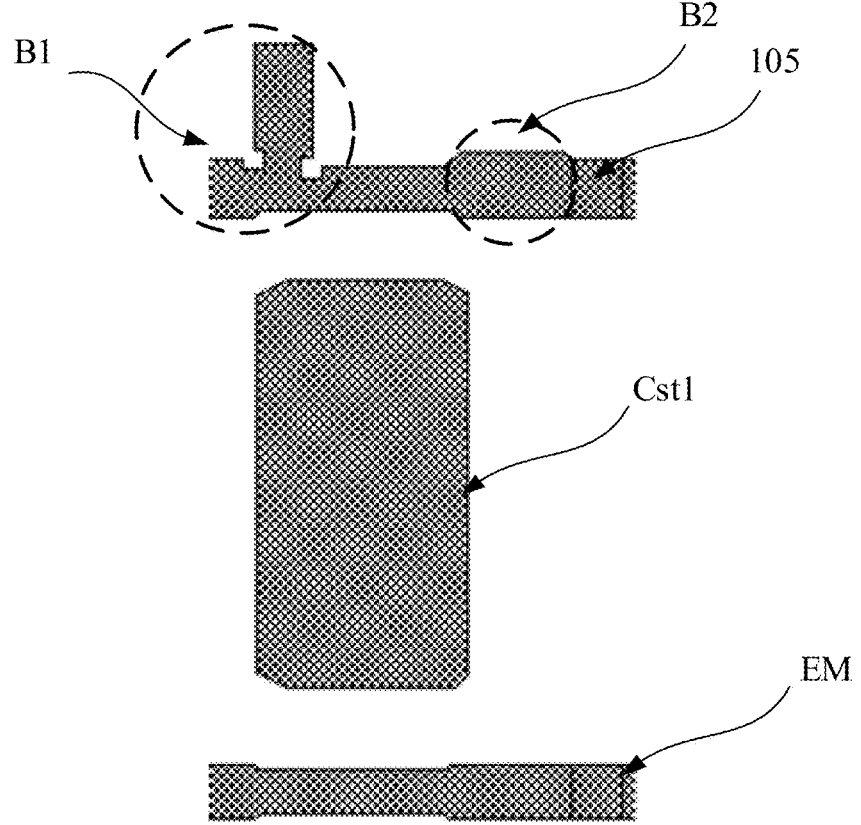
Figure 8:
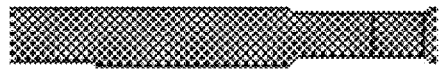

FIG. 8 is a wiring diagram of the first gate layer (Gate 1) of FIG. 5. Referring to FIG. 8, the first gate layer includes gate lines 105, a first capacitive plate Cst 1, and a light-emitting control line EM.

Two gate lines 105 are arranged in one row of pixels, wherein one of the gate lines 105 is designed with a gate B1 of the first transistor and a gate B2 of the second transistor.

The gate B1 of the first transistor is a double-gate structure which has a T-shaped structure, wherein an L-shaped structure in the T-shaped structure and an L-shaped structure of the channel connection region A1 are inversely superimposed on each other to enclose a square region.

Figure 9:
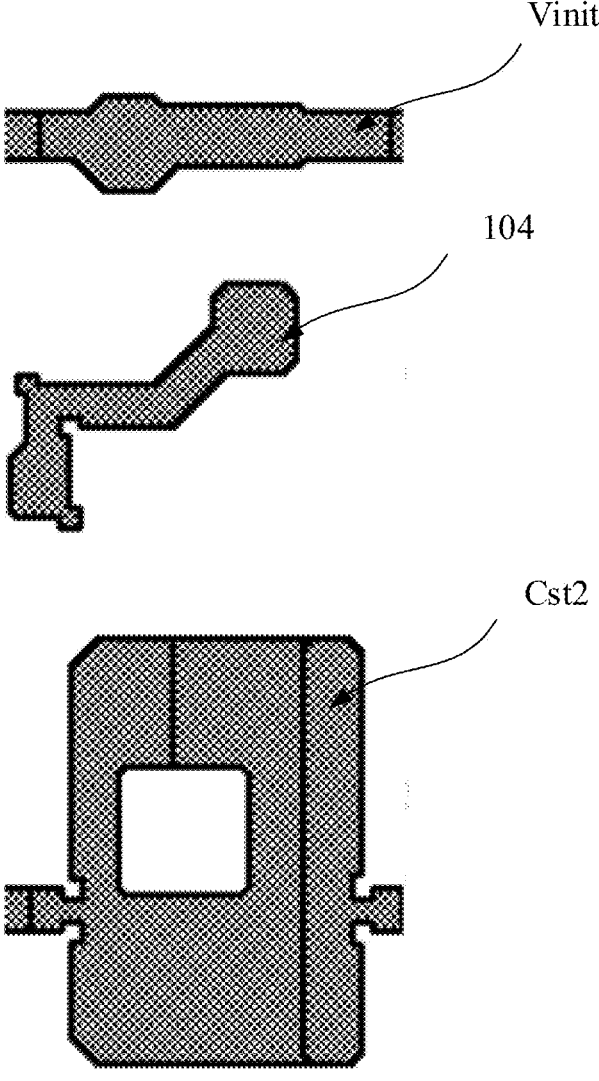
FIG. 9 is a wiring diagram of a second gate layer according to some embodiments of the present disclosure.
Figure 9:

FIG. 9 is a wiring diagram of the second gate layer (Gate 2) of FIG. 5. Referring to FIG. 9, the second gate layer includes a shield 104, an initial voltage line Vinit, and a second capacitive plate Cst 2.

The first capacitive plate Cst 1 and the second capacitive plate Cst 2 together form a storage capacitor, which is a capacitor Cst in a circuit of 7T1C or the like. The shield 104 is configured to shield the active layer from leakage currents and form a capacitor with the active layer. The capacitor is configured to stabilize the voltage of a thin-film transistor in the 7T1C. The Vinit signal line is configured to supply an initial voltage signal.

Figure 10:
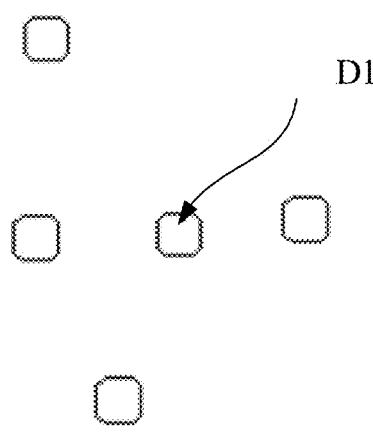
FIG. 10 is a schematic layout diagram of a via according to some embodiments of the present disclosure.
Figure 10:
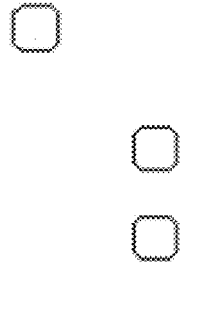
Figure 10:
Figure 10:

FIG. 10 is a schematic layout diagram of the vias (ILD vias) of FIG. 5. Referring to FIG. 10, the plurality of vias includes vias D1, which are the vias where the shield 104 is connected to the power voltage line 101. The roles of the other vias are not described in detail in the embodiments of the present disclosure.

Figure 11:
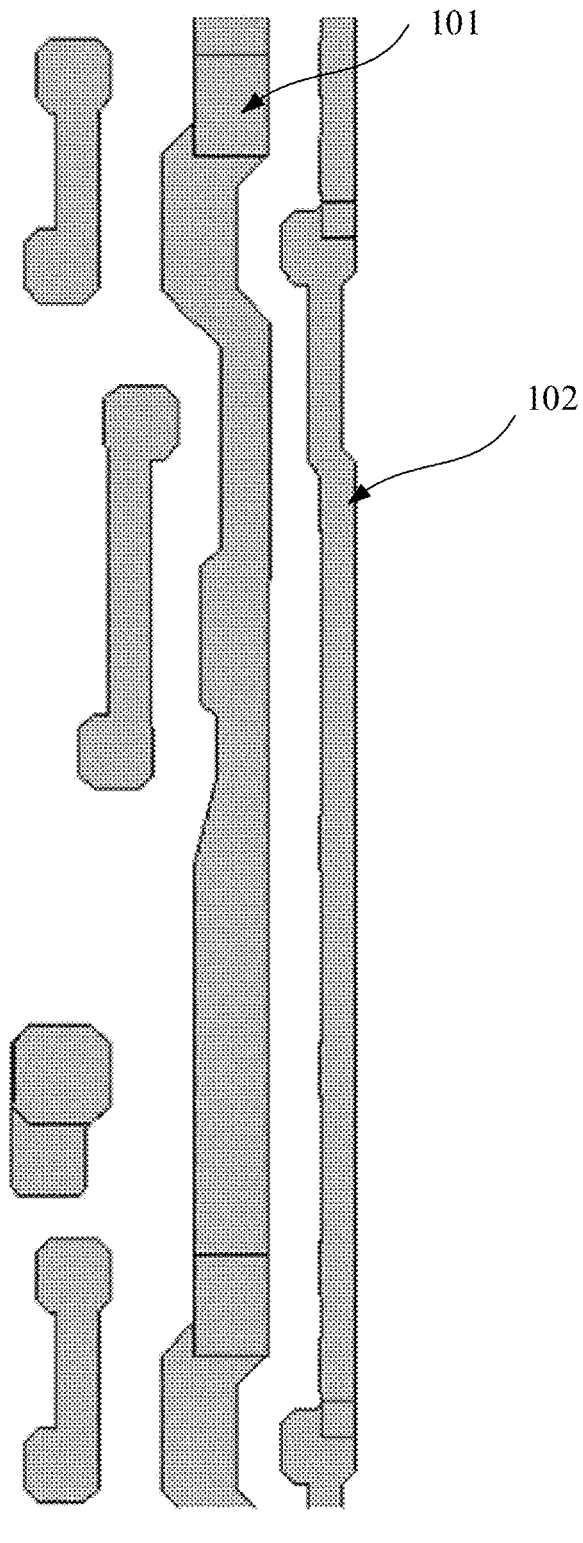
FIG. 11 is a wiring diagram of a first conductive layer according to some embodiments of the present disclosure.

FIG. 11 is a wiring diagram of the first conductive layer (SD) of FIG. 5. Referring to FIG. 11, the first conductive layer includes the power voltage line 101 and the data line 102, in addition to the source and the drain of the transistor.

In some embodiments, the first conductive layer further includes a connection line for realizing an electrical connection between the via and/or the signal line.

By stacking the layers illustrated in FIGS. 7 to 11, the wiring diagram of the partial display pixel driver circuit of FIG. 5 is ultimately formed.

As described above, the first transistor includes a source, a drain, and double gates. An active layer of a first sub-transistor of the first transistor includes the source and a channel portion. An active layer of a second sub-transistor includes a channel portion and the drain. The channel portions of the two sub-transistors are connected by a channel connection region. An orthographic projection of the channel portion of each of the two sub-transistors on the base substrate is overlapped with an orthographic projection of the double gates on the base substrate.

For the second transistor described above, the wiring and connection of the gate of the second transistor and the double gates of the first transistor are both disposed in the first gate layer. Two ends of the active layer of the second transistor are connected to the power voltage line and the data signal line respectively. An orthographic projection of a channel portion of the second transistor on the base substrate is overlapped with an orthographic projection of the gate on the base substrate to form a cross-shaped region.

According to the embodiments of the present disclosure, through an optimized design of the wiring, a channel (poly) between the double gates of T2 (the first transistor) is shielded by connecting the VDD signal line of the pixels in the column to the shield. In this way, not only the overlapping between the shield and the data or other signal lines is prevented and data loading is reduced, but also the T2 of a column of display sub-pixels on the leftmost edge of the display panel is shielded, thereby improving the display effect.

According to the embodiments of the present disclosure, not only the wiring for the display region is optimized, but also the non-display region outside the display region is optimized. For example, designs for compensating the data capacitance by dummy pixels (virtual sub-pixels) filling at four corners and for lowering loading by reducing anode coverage at the four corners are proposed for products featuring a four-corner square outer frame and implementing arc display.

For the non-display region, the virtual sub-pixel includes a virtual pixel drive circuit and a virtual light-emitting unit. A boundary of the virtual pixel drive circuit in a row direction is the same as a boundary of the display pixel drive circuit in the row direction. A boundary of the virtual sub-pixel drive circuit in a column direction is the same as a boundary of the display pixel drive circuit in the column direction.

Figure 12:
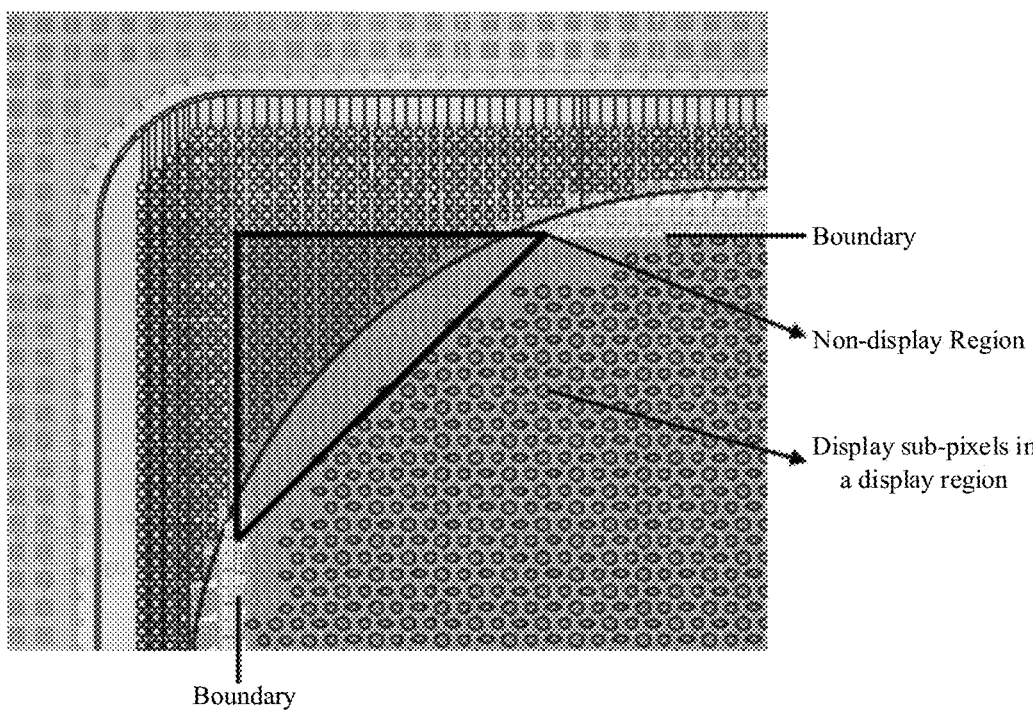
FIG. 12 is a schematic diagram of a corner of a display panel, including a non-display region provided in a corner outside a display region.

FIG. 12 is a schematic diagram of a corner of a display panel, including a non-display region provided in a corner outside a display region.

Referring to FIG. 12, a virtual pixel drive circuit for filling boundaries are bounded by a boundary row and a boundary column where display sub-pixels are disposed. Virtual sub-pixels are placed outside a region for arc display to realize the compensation for the data capacitance. In this way, the compensation for the data capacitance is more accurate compared with the compensation for the data capacitance only through the metal in the gate layer in some practices, and a wiring environment of the compensation region is consistent with that in the display region. A connection line from the Gate on Array (GOA) circuit to the display region is more uniform, thereby reducing the parasitic capacitance of the wiring and improving the display effect.

As illustrated in FIG. 12, a region defined a triangle is a portion of the non-display region where the virtual sub-pixels are disposed. Designing the boundaries of rows and columns of the virtual sub-pixels to be consistent with the boundaries of the display region facilitates arrangements the virtual sub-pixels and the signal lines. At the same time, in a column direction, each column of the virtual sub-pixels and a corresponding column of the display sub-pixels share the same data line, thereby realizing compensation for the capacitance of the data lines.

No pixel structures are arranged in portions of the non-display region outside the triangle in FIG. 12. The triangle is only an example. In other embodiments, the region in which the virtual sub-pixels are arranged is of other shapes, which is not limited in the embodiments of the present disclosure.

During wiring, the pixel drive circuit for the display region is connected to the anode layer by vias in a planarization layer, i.e., the vias are prepared in the planarization layer, and then the anode layer is prepared, which in turn allows the pixel drive circuit to be connected to the anode layer by the vias.

In some practices, the coupling capacitance of the cathode layer of the display panel is also greater in the case that the cathode layer of the display panel is entirely laid. Therefore, in the embodiments of the present disclosure, virtual light-emitting units of the virtual sub-pixels are redesigned. The pixel drive circuit layer further includes an anode layer disposed on a side, away from the base substrate, of the first conductive layer, and a cathode layer disposed on a side, away from the base substrate, of the anode layer.

The anode layer includes an anode of the light-emitting unit disposed on the display region and an anode of the virtual light-emitting unit disposed on the non-display region. The anode of the virtual light-emitting unit is entirely laid, that is, the anode layer of the non-display region is integrally formed.

The anode layer on the non-display region is connected to a low power voltage line (VSS signal line, cathode signal) to transmit a low power voltage signal through the anode layer to the cathode layer on the display region, wherein the cathode layer includes a cathode of the light-emitting unit disposed on the display region. The virtual pixel drive circuit is not connected to the anode layer on the non-display region.

In some embodiments, the cathode layer which has been entirely laid is only laid in the display region, that is, the cathode layer is not laid in the non-display region and no cathode is provided.

By introducing a VSS signal through the anode layer on the non-display region (the triangular region illustrated in FIG. 9), an area of the VSS increases with the increase of an area of the anode, thereby reducing the power consumption of a panel. In the case of the cathode is lapped to a certain degree, the cathode layer is not laid in the non-display region, such that an area of the cathode is reduced, and the loading of the cathode is also reduced.

In summary, the embodiments of the present disclosure provide a design scheme for optimizing the wiring and reducing the data loading, compensating the data capacitance by dummy pixels filing at four corners and for lowering loading by reducing anode coverage at the four corners for products featuring a four-corner square outer frames and implementing arc display, thereby achieving the purposes of optimizing the display, reducing loading, and reducing the power consumption.

The embodiments of the present disclosure also provide an electronic device. The electronic device at least includes the display panel provided in the above embodiments of the present disclosure. The wiring design of the display panel is not described herein.

Exemplarily, the electronic device provided by the embodiments of the present disclosure is a cell phone, a tablet computer, a television set, a display device, a laptop computer, a digital photo frame, a navigator, and any other product or component having a display function.

In addition, although some exemplary embodiments have been described herein, the scope includes any and all embodiments based on the present disclosure that have equivalent elements, modifications, omissions, combinations (e.g., crossing solutions in which various embodiments), adaptations, or alterations. The elements in the claims are construed broadly based on the language employed in the claims and are not limited to the examples described in the specification or during the prosecution of the present disclosure, and the examples are construed as non-exclusive. Accordingly, the specification and the examples are intended to be considered exemplary only, and the true scope and spirit are indicated by the full scope of the following claims, as well as their equivalents.

The descriptions above are intended to be illustrative and not limited. For example, the examples above (one or more embodiments) may be used in combination with one another. For example, a person of ordinary skill in the art may use other embodiments when reading the above descriptions. In addition, in the specific embodiments described above, various features may be grouped together to simplify the present disclosure. This should not be construed as an intent that features of the disclosure that do not require protection are necessary for either claim. Rather, the subject matter of the present disclosure may be less than all of the features of a particular disclosed embodiment. Therefore, the following claims are incorporated herein as examples or embodiments in specific embodiments, wherein each claim is independently treated as a separate embodiment and it is contemplated that these embodiments may be combined with each other in various combinations or arrangements. The scope of the present disclosure should be determined with reference to the full scope of the appended claims and the equivalent forms conferred by the claims.

A number of embodiments of the present disclosure are described in detail above, but the present disclosure is not limited to these specific embodiments. Those skilled in the art are capable of making a variety of variations and modifications of embodiments based on the ideas of the present disclosure, which shall fall within the scope of the protection claimed in the present disclosure.

The invention claimed is:

1. A display panel, comprising:

a base substrate having a display region; and a plurality of display sub-pixels, a plurality of power voltage lines, and a plurality of data signal lines that are disposed in the display region, wherein each of the display sub-pixels comprises a display pixel drive circuit, and the power voltage lines and the data signal lines are connected to the display pixel drive circuits;

wherein each of the display pixel drive circuits comprises at least a first transistor and a second transistor connected to the first transistor, wherein each of the data signal lines is connected to the second transistor, each of the first transistor and the second transistor comprises an active layer, and the first transistor further comprises a shield connected to each of the power voltage lines, an orthographic projection of the shield on the base substrate being at least partially overlapped with an orthographic projection of a channel connection region of the active layer of the first transistor on the base substrate, and an orthographic projection of the shield and the data signal line being not overlapped with an orthographic projection of the active layer of the second transistor on the base substrate.

2. The display panel according to claim 1, wherein the display sub-pixels are arranged in a plurality of columns, each column of the display sub-pixels corresponding to one of the power voltage lines; and the shield is connected to the power voltage line corresponding to the display sub-pixel where the shield is disposed.

3. The display panel according to claim 1, further comprising: a semiconductor layer, a first gate layer, a second gate layer, and a first conductive layer that are sequentially stacked on the base substrate, wherein the semiconductor layer comprises the active layers of the first transistor and the second transistor.

4. The display panel according to claim 3, wherein the shield is disposed on the second gate layer.

5. The display panel according to claim 1, wherein the base substrate further has a non-display region disposed outside the display region, and the display panel further comprises a plurality of virtual sub-pixels disposed in the non-display region;

wherein each of the virtual sub-pixels comprises a virtual pixel drive circuit, a boundary of the virtual pixel drive circuit in a row direction being the same as a boundary of the display pixel drive circuit in the row direction, and a boundary of the virtual sub-pixel drive circuit in a column direction being the same as a boundary of the display pixel drive circuit in the column direction.

6. The display panel according to claim 5, wherein
the virtual sub-pixel further comprises a virtual light-emitting unit; and
the display panel further comprises an anode layer comprising an anode of the virtual light-emitting unit, which is laid in an entire layer.

7. The display panel according to claim 6, wherein
the display panel further comprises a cathode layer on a side, away from the base substrate, of the anode layer;
the display sub-pixel further comprises a light-emitting unit driven by the display pixel drive circuit to emit light; and
the anode of the virtual light-emitting unit is connected to a low power voltage line to transmit a low power voltage signal supplied by the low power voltage line through the anode layer to a cathode layer of the display region, the cathode layer comprising a cathode of the light-emitting unit.

8. The display panel according to claim 7, wherein the virtual pixel drive circuit is not connected to the anode of the virtual light-emitting unit.

9. The display panel according to claim 3, wherein
the first transistor comprises a source, a drain, and double gates;
wherein the source and the drain are disposed in the first conductive layer, and the double gates are disposed in the first gate layer.

10. The display panel according to claim 9, wherein
the source and the drain of the first transistor are connected through the active layer of the first transistor, and the active layer connecting the source to the drain has at least one L-shaped structure; and
the double gates have a T-shaped structure, and one of L-shaped structures in the T-shaped structure is reversely superimposed with the L-shaped structure of the active layer to enclose a square region.

11. An electronic device, comprising: a display panel; wherein
the display panel comprises:
a base substrate having a display region; and
a plurality of display sub-pixels, a plurality of power voltage lines, and a plurality of data signal lines that are disposed in the display region, wherein each of the display sub-pixels comprises a display pixel drive circuit, and the power voltage lines and the data signal lines are connected to the display pixel drive circuits;
wherein each of the display pixel drive circuits comprises at least a first transistor and a second transistor connected to the first transistor, wherein each of the data signal lines is connected to the second transistor, each of the first transistor and the second transistor comprises an active layer, and the first transistor further comprises a shield connected to each of the power voltage lines, an orthographic projection of the shield on the base substrate being at least partially overlapped with an orthographic projection of a channel connection region of the active layer of the first transistor on the base substrate, and an orthographic projection of the shield and the data signal line being not overlapped with an orthographic projection of the active layer of the second transistor on the base substrate.

12. The electronic device according to claim 11, wherein
the display sub-pixels are arranged in a plurality of columns, each column of the display sub-pixels corresponding to one of the power voltage lines; and
the shield is connected to the power voltage line corresponding to the display sub-pixel where the shield is disposed.

13. The electronic device according to claim 11, wherein the display panel further comprises: a semiconductor layer, a first gate layer, a second gate layer, and a first conductive layer that are sequentially stacked on the base substrate, wherein the semiconductor layer comprises the active layers of the first transistor and the second transistor.

14. The electronic device according to claim 13, wherein the shield is disposed on the second gate layer.

15. The electronic device according to claim 11, wherein the base substrate further has a non-display region disposed outside the display region, and the display panel further comprises a plurality of virtual sub-pixels disposed in the non-display region;
wherein each of the virtual sub-pixels comprises a virtual pixel drive circuit, a boundary of the virtual pixel drive circuit in a row direction being the same as a boundary of the display pixel drive circuit in the row direction, and a boundary of the virtual sub-pixel drive circuit in a column direction being the same as a boundary of the display pixel drive circuit in the column direction.

16. The electronic device according to claim 15, wherein
the virtual sub-pixel further comprises a virtual light-emitting unit; and
the display panel further comprises an anode layer comprising an anode of the virtual light-emitting unit, which is laid in an entire layer.

17. The electronic device according to claim 16, wherein
the display panel further comprises a cathode layer on a side, away from the base substrate, of the anode layer;
the display sub-pixel further comprises a light-emitting unit driven by the display pixel drive circuit to emit light; and
the anode of the virtual light-emitting unit is connected to a low power voltage line to transmit a low power voltage signal supplied by the low power voltage line through the anode layer to a cathode layer of the display region, the cathode layer comprising a cathode of the light-emitting unit.

18. The electronic device according to claim 17, wherein the virtual pixel drive circuit is not connected to the anode of the virtual light-emitting unit.

19. The electronic device according to claim 13, wherein
the first transistor comprises a source, a drain, and double gates;
wherein the source and the drain are disposed in the first conductive layer, and the double gates are disposed in the first gate layer.

20. The electronic device according to claim 19, wherein
the source and the drain of the first transistor are connected through the active layer of the first transistor, and the active layer connecting the source to the drain has at least one L-shaped structure; and
the double gates have a T-shaped structure, and one of L-shaped structures in the T-shaped structure is reversely superimposed with the L-shaped structure of the active layer to enclose a square region.

* * * * *